US007965290B1

(12) United States Patent
Kouznetsov et al.

(10) Patent No.: US 7,965,290 B1
(45) Date of Patent: Jun. 21, 2011

(54) METHOD, SYSTEM, AND DATA STRUCTURE FOR PROGRESSIVE LOADING AND PROCESSING OF A 3D DATASET

(75) Inventors: Vladimir Kouznetsov, Richmond (CA); Lev N. Gretskii, Richmond (CA); Filip Petrovic, Vancouver (CA)

(73) Assignee: NGRAIN (Canada) Corporation, Vancouver (CA)

( * ) Notice: Subject to any disclaimer, the term of this patent is extended or adjusted under 35 U.S.C. 154(b) by 866 days.

(21) Appl. No.: 11/777,991

(22) Filed: Jul. 13, 2007

(51) Int. Cl.
*G06T 15/00* (2006.01)
(52) U.S. Cl. .................... 345/419; 345/420; 345/424
(58) Field of Classification Search .................. None
See application file for complete search history.

(56) References Cited

U.S. PATENT DOCUMENTS

| | | | |
|---|---|---|---|
| 6,031,548 A | 2/2000 | Gueziec | |
| 6,670,969 B1 * | 12/2003 | Halstead et al. | 715/762 |
| 6,867,774 B1 * | 3/2005 | Halmshaw et al. | 345/424 |
| 7,050,054 B2 | 5/2006 | Halmshaw | |
| 7,218,323 B1 | 5/2007 | Halmshaw et al. | |
| 7,317,456 B1 | 1/2008 | Lee | |
| 2004/0212615 A1 * | 10/2004 | Uthe | 345/440 |
| 2005/0248573 A1 * | 11/2005 | Grassia et al. | 345/473 |
| 2007/0229501 A1 | 10/2007 | Kouznetsov et al. | |

FOREIGN PATENT DOCUMENTS

| | | |
|---|---|---|
| WO | 0207088 A2 | 1/2002 |
| WO | 0207089 A2 | 1/2002 |

OTHER PUBLICATIONS

Woo, A. et al., "Myths and Truths of Interactive Volume Graphics," Interservice/Industry Training, Simulation and Education Conference (I/ITSEC), 2004, 10 pages, No. 1755.

* cited by examiner

*Primary Examiner* — Said Broome
(74) *Attorney, Agent, or Firm* — Seed IP Law Group PLLC

(57) ABSTRACT

A method is provided to progressively load and further process data in a hierarchical lock-free structure. The method includes generally four steps: (a) defining the hierarchical lock-free structure, (b) loading the data into the hierarchical lock-free structure; (c) processing the loaded data, and (d) repeating steps (b) and (c) such that progressively more data are loaded and become available for processing. The hierarchical lock-free structure includes a first level of data including data segments, wherein each of the data segments forms a second level of data. The structure is such that each of the data segments in the second level of data becomes available for further processing when the data segment is referenced in the first level of data. Thus, during the loading step (b), a reference is set in the first level of data to each of the data segments in the second level of data as the data segment is loaded. Then, the processing step (c) process each of the data segments in the second level of data to which a reference is set in the first level of data.

19 Claims, 9 Drawing Sheets

METHOD, SYSTEM, AND DATA STRUCTURE FOR PROGRESSIVE LOADING AND PROCESSING OF A 3D DATASET

BACKGROUND

Three-dimensional ("3D") digital data may be produced by a variety of devices that involve three-dimensional scanning or sampling and/or numerical modeling. For example, computed tomography (CT) and magnetic resonance imaging (MRI) devices scan portions of the human body and generate image slices of the body, which when combined or stacked, generate a 3D representation of the body, including its surface and internal volume.

Volume graphics represent a promising way to achieve the degree of realism required for high quality 3D simulations and visualization applications because volume models can contain all the surface and internal characteristics of a real object. This is in contrast to, for example, polygon-based graphics, which contain only the information about the surfaces of a 3D object. In the case of volume graphics, volume elements (i.e., "voxels") are the base data used to represent 3D objects. Typically, voxels are simply pixels that have a third coordinate z in addition to x and y coordinates in a Cartesian coordinate system (though voxels may also take various other forms). In other words, voxels are equally sized cubes that form a discretely defined 3D space. A typical voxel-based 3D scene can consist of one or more "voxel sets", each of which in turn consists of one or more voxels. For example, the 3D scene may include one or more sets of MRI slices, each forming a voxel set, which in turn includes a plurality of voxels within each voxel set. 3D voxel data are rendered to produce a 2D image on a suitable output device, such as a video display or a printer. As used herein, the term "render" means to produce a 2D graphics image on an output device from a 3D voxel data file.

NGRAIN® graphics technology, embodied in various software available from NGRAIN Corp. of Vancouver B.C., Canada, offers a volume-graphic based 3D visualization platform to build real time interactive 3D applications. Briefly, NGRAIN® technology permits 3D modeling of an object, wherein each of multiple parts or layers forming the object can be represented as a voxel set each consisting of one or more voxels. Thus, according to NGRAIN® technology, it is possible to manipulate each part or layer independently from each other or from the object as a whole, in 3D space, such as to create an exploded view of the object to show the details of its parts, or to peel off an outer layer of the object to reveal its inner layer. Since the voxel data structure used in NGRAIN® technology permits each voxel to be associated with an unlimited number of attributes (color, texture, normal, weight, density, etc.), these attributes can be used to give a rendered image a highly realistic look. Further, the voxel data structure and routines used to construct, manipulate, and render voxel data are such that specialized graphics hardware is not required—NGRAIN® technology can run on any conventional personal computer, including a laptop.

Various details of NGRAIN® technology are described in commonly owned Patent Cooperation Treaty Publication No. WO 02/07088 A2 entitled "LIGHTING ADJUSTMENT METHODS AND APPARATUS FOR VOXEL DATA," commonly owned Patent Cooperation Treaty Publication No. WO 02/07089 A2 entitled "APPARATUS AND METHOD FOR ASSOCIATING VOXEL INFORMATION WITH DISPLAY POSITIONS," commonly owned U.S. Pat. No. 6,867,774 B1 entitled "METHOD AND APPARATUS FOR TRANSFORMING POLYGON DATA TO VOXEL DATA FOR GENERAL PURPOSE APPLICATIONS," commonly owned U.S. Pat. No. 7,050,054 B2 entitled "METHOD, APPARATUS, SIGNALS AND CODES FOR ESTABLISHING AND USING A DATA STRUCTURE FOR STORING VOXEL INFORMATION," commonly owned U.S. Pat. No. 7,218,323 B1 entitled "METHOD AND SYSTEM FOR RENDERING VOXEL DATA WHILE ADDRESSING MULTIPLE VOXEL SET INTERPENETRATION," commonly owned U.S. patent application Ser. No. 10/309,411 entitled "METHOD AND APPARATUS FOR TRANSFORMING POINT CLOUD DATA TO VOLUMETRIC DATA," and commonly owned U.S. patent application Ser. No. 11/396,373 entitled "METHOD AND SYSTEM FOR ORGANIZING AND RENDERING MULTIPLE GEOMETRIC PARTS WITHIN A VOLUME GRAPHICS DATA SET," which are all specifically incorporated herein by reference. Additional details of NGRAIN® technology can also be found in an article, "Myths and Truths of Interactive Volume Graphics", a paper that has been published in I/ITSEC 2004 Conference.

FIG. 1A illustrates an object 1 in the form of an airplane, which consists of eight parts (1 fuselage (1), 2 wings (2)(3), 2 engines (4)(5), 1 vertical stabilizer (6), and 2 horizontal stabilizers (7)(8)). Each part is represented by a voxel set including multiple voxels. For example, FIG. 1B shows a voxel set 2 that represents a horizontal stabilizer (7) of FIG. 1A, including multiple voxels arranged in x-y-z Cartesian coordinate system. Each voxel within the voxel set 2 is defined by its geometric location (x, y, z), in the Cartesian coordinate system. Each voxel is associated with a set of attributes, such as its shade information including color and alpha values, normal vector, texture, part/layer number (i.e., to which voxel set it belongs), etc. Voxels that are occupied by an object are termed occupied voxels 3, whereas voxels that are not occupied are termed empty voxels 4. Each voxel set may contain occupied voxels and/or empty voxels, and typically only occupied voxels are associated with attributes.

With the use of multiple parts (or multiple voxel sets) to render an object, there remains a risk of deadlocking during loading and rendering of these parts. Deadlocking is a situation where two or more processes (e.g., threads that may execute in parallel) wait for each other, and thus neither can proceed. For example, a load thread that loads 3D voxel data from a disk storage or a network onto a user computer (e.g., a personal computer) and a display thread that renders the loaded 3D voxel data on a display screen of the user computer may deadlock, halting the entire operation.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one aspect, the present invention provides a method of progressively loading and further processing (e.g., displaying) data in a hierarchical lock-free structure. The method includes generally four steps: (a) defining the hierarchical lock-free structure, (b) loading the data into the hierarchical lock-free structure; (c) processing (e.g., displaying) the loaded data, and (d) repeating steps (b) and (c) such that progressively more data are loaded and become available for processing (e.g., displaying).

Specifically, the hierarchical lock-free structure includes a first level of data including data segments, wherein each of the data segments in turn forms a second level of data. The structure is such that each of the data segments in the second level of data becomes available for further processing only when that data segment is referenced in the first level of data. Thus, during the loading step (b), a reference is set in the first level of data to each of the data segments in the second level of data as that data segment is loaded. Then, the processing step (c) processes each of the data segments in the second level of data to which a reference is set in the first level of data.

In accordance with one aspect of the invention, the data having a hierarchical lock-free structure are 3D data, and the processing step (c) displays (renders) the 3D data as a 2D image on a display screen. According to the present method, the first level of data can be displayed while it is still incomplete and is being progressively loaded, without triggering deadlocking between a load thread and a display thread.

In accordance with a further aspect of the invention, in the data structure having a hierarchical lock-free structure, at least one data segment includes data sub-segments, and each of the data sub-segments in turn forms a third level of data. The structure is such that each of the data sub-segments in the third level of data becomes available for further processing only when that data sub-segment is referenced in the second level of data. In this example, the loading step (b) further includes setting a reference in the second level of data to each of the data sub-segments in the third level of data as that data sub-segment is loaded. The processing step (c) further includes processing each of the data sub-segments in the third level of data to which a reference is set in the second level of data. Also, the repeating step (d) results in progressively more data sub-segments being loaded to become available for further processing. According to the present method, each of the first level of data and the second level of data can be processed while it is still incomplete and is being progressively loaded.

In accordance with another aspect of the invention, the data having a hierarchical lock-free structure are 3D data, and the first level of data defines an object including multiple parts. At least one of the data segments in the second level of data defines a part including multiple columns, and each of the data sub-segments in the third level of data defines a column.

In accordance with another aspect, the present invention provides a computer-readable tangible medium including computer-executable instructions which, when loaded onto a computer, perform the method summarized above.

In accordance with yet another aspect, the present invention provides hierarchical lock-free data structure embodied in a computer-readable memory device. The structure includes a first level of data including data segments, wherein each of the data segments forms a second level of data. The structure is such that a reference is set in the first level of data to each of the data segments in the second level of data as the data segment is loaded. Also, the structure is such that each of the data segments in the second level of data becomes available for further processing when the data segment is referenced in the first level of data.

In accordance with a further aspect, the present invention offers a system for progressively loading and displaying 3D data in a hierarchical lock-free structure. The structure includes a first level of data including data segments, wherein each of the data segments forms a second level of data, and each of the data segments in the second level of data becomes available for display when the data segment is referenced in the first level of data. The system includes a memory into which the 3D data are loaded, a display screen, and a processing unit coupled to the memory and the display screen. The processing unit is configured to execute program code for performing generally three steps: (a) loading the 3D data into a hierarchical lock-free structure and setting a reference in the first level of data to each of the data segments in the second level of data as the data segment is loaded; (b) displaying each of the data segments in the second level of data to which a reference is set in the first level of data; and (c) repeating steps (a) and (b) such that progressively more data segments are loaded to become available for display.

According to various exemplary embodiments, the present invention provides a method, system, and data structure that logically guarantee prevention of deadlocking in the context of 3D data loading and rendering. The invention takes advantage of atomic operation capability available in most processors. 3D data are progressively loaded by selective use of atomic operations, to thereby "hot-plug-in" new pieces of data (e.g., new parts of an object) at arbitrary moments, each in a single operation without an interruption (i.e., in an atomic operation). Specifically, atomic operations are used to "hot-plug-in" new pieces of data, to which references are set. The data structure allows hot-plugging-in of new pieces of data without a need to reshuffle existing pieces of data. At the same time as the progressive load thread is executing, a display thread executes to display any new pieces of data as they become available for display (or, as they are "hot-plugged-in"). Since the pieces of data that are loaded and become available for display (or any other further processing) are always complete (due to the use of references), it is logically impossible for the display thread to attempt to render any incomplete data, which in turn may trigger crash. Conventional techniques of preventing such crashes use synchronization, which is prone to deadlocking. Accordingly, the present invention offers a method, system, and data structure that logically guarantee avoidance of deadlocking and various costs associated with trying to prevent deadlocking, such as costs of designing, testing, and debugging synchronization code (which is still prone to deadlocking). Further, since the method takes advantage of atomic operations and thus does not require either of the threads to wait on locks, both threads can better utilize available hardware resources to thereby improve overall performance. (Previously, locks were used to synchronize access by multiple threads to dynamically changing data, such that only one thread is running at any given time while other thread(s) wait.)

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 2:
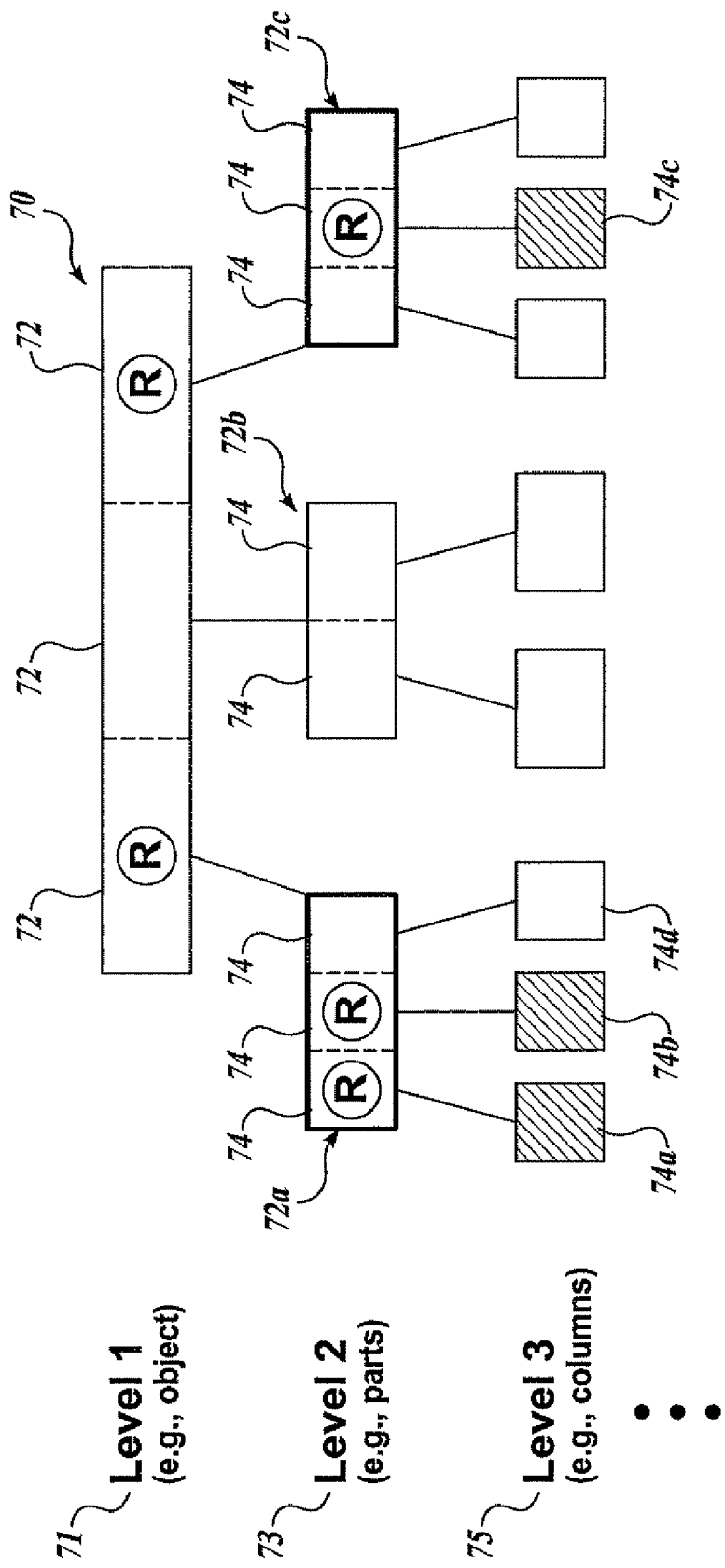
FIG. 2 is a schematic diagram illustrating a hierarchical lock-free data structure according to one aspect of the present invention.

FIG. 2 is a diagram illustrating a hierarchical lock-free data structure 70 according to one aspect of the present invention. The structure 70 includes a first level of data 71 including data segments 72 (three segments are shown), and each of the data segments 72a, 72b, and 72c in turn forms a second level of data 73. In the illustrated example, each of the data segments 72a, 72b, and 72c further includes data sub-segments 74, which in turn forms a third level of data 75.

When any of the data segments in the second level of data 73 is loaded, a reference (shown as $\hat{R}$ in FIG. 2) is set in the first level of data 71 to each of the loaded data segments in the second level of data 73. In the illustrated example, two data segments 72a and 72c are loaded (or, more specifically, ready to be loaded such that they are fully or at least partially loaded), and thus two references $\hat{R}$ are set correspondingly in the first level of data 71. Likewise, when any of the data sub-segments in the third level of data 75 is loaded, reference $\hat{R}$ is set in the second level of data 73 to each of the loaded data sub-segments in the third level of data 75. In the illustrated example, three data sub-segments 74a, 74b, and 74c are loaded, and thus three references $\hat{R}$ are set correspondingly in the second level of data 73.

Only those data segments and data sub-segments to which references $\hat{R}$ are set become available for further processing, such as rendering/displaying. In the example of FIG. 2, only the data segments 72a and 72c, to which references $\hat{R}$ are set in the first level of data 71, and the data segments 74a, 74b, and 74c, to which references $\hat{R}$ are set in the second level of data 73, become available for further processing. Therefore, loading of the data into such structure can occur in a progressive manner, with increasingly more data segments and data sub-segments becoming available for further processing.

Note that the data structure permits processing (e.g., rendering) of "incomplete" data as the data become increasingly available. For example, in FIG. 2, the data sub-segments 74a and 74b in the third level of data 75 are processed (e.g., rendered) despite that the data segment 72a, to which the data sub-segments 74a and 74b belong, is not fully loaded (missing a data sub-segment 74d). Likewise, the data sub-segment 74c is processed despite that the data segment 72c, to which the data sub-segment 74c belongs, is not fully loaded. Similarly, the data segments 72a and 72c are processed despite that the first level of data 71, to which they belong, are not fully loaded (missing the data segment 72b). Progressive processing of such "incomplete" data (except at the lowest level of data) is possible because the use of references $\hat{R}$ ensures that only those fully-loaded data sub-segments (and data segments including those fully-loaded data sub-segments) become available for further processing, while data to which no reference is set are simply ignored. As loading progresses, more and more data become fully-loaded and become available for further processing, without triggering deadlocking.

While FIG. 2 illustrates three levels of data, only two levels of data may be used, or four or more levels of data may be used, as should be apparent to one skilled in the art. For example, a hierarchical lock-free data structure may include level "0" representing a collection of multiple "first level of data" and/or the fourth level of data representing data sub-sub-segments forming each of the data sub-segments in the third level of data. As before, in the case in which four levels of data are used, for example, only those data segments, sub-segment, and sub-sub-segments to which references $\hat{R}$ are set in the immediately above level of data become available for further processing. Further as before, loading of the data into such structure can occur in a progressive manner, with increasingly more data segments, sub-segments, and sub-sub segments becoming available for further processing.

As one skilled in the art will appreciate, the hierarchical lock-free data structure described above in a general form can be applied in various embodiments or in specific datasets. Below, a description of one sample dataset will be provided, in which the first, second, and third levels of data are embodied in 3D voxel data representing an object, parts (forming the object), and columns (forming each part), respectively. As discussed above, 3D voxel data may be represented, instead, in two levels of data, or in four or more levels of data. For example, a hierarchical lock-free data structure may include level "0" representing a collection of multiple "objects" and/or the fourth level of data representing sub-columns forming each column. As another example, a hierarchical lock-free data structure may include the first level of data representing an object, the second level of data representing parts forming the object, the third level of data representing sub-parts forming each part, and the fourth level of data representing columns forming each sub-part. As should be apparent from the foregoing description, the present invention encompasses various embodiments of a hierarchical lock-free data structure, and is not limited by the number of levels of data to be used, or by the manner in which a dataset is logically subdivided to form multiple levels.

Figure 1A:
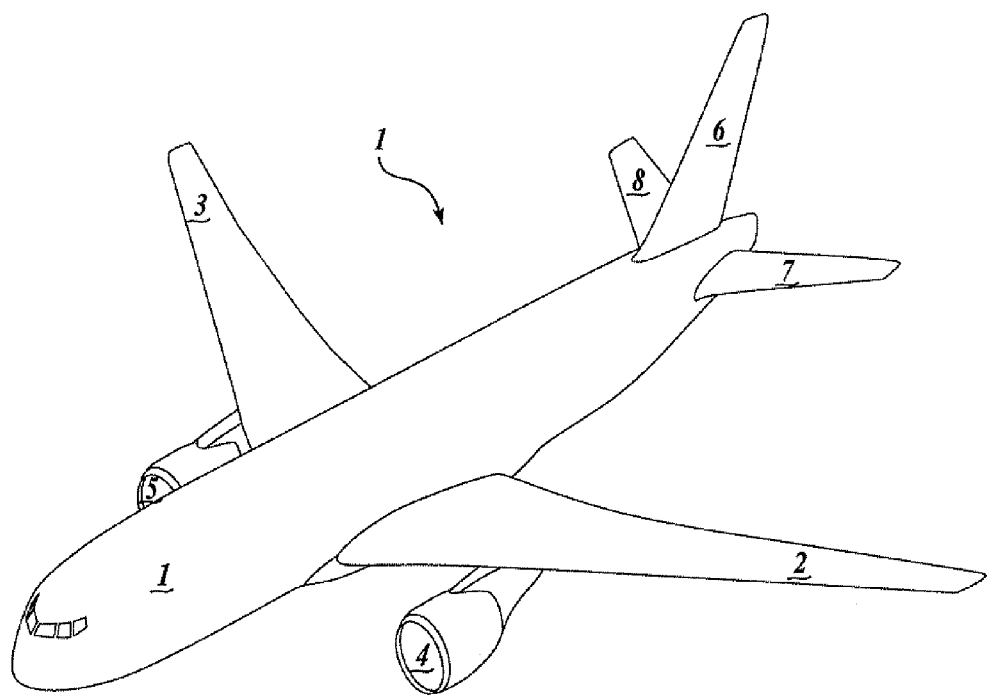
FIG. 1A is a schematic view of an object (an airplane in this example) consisting of eight parts.
Figure 1B:
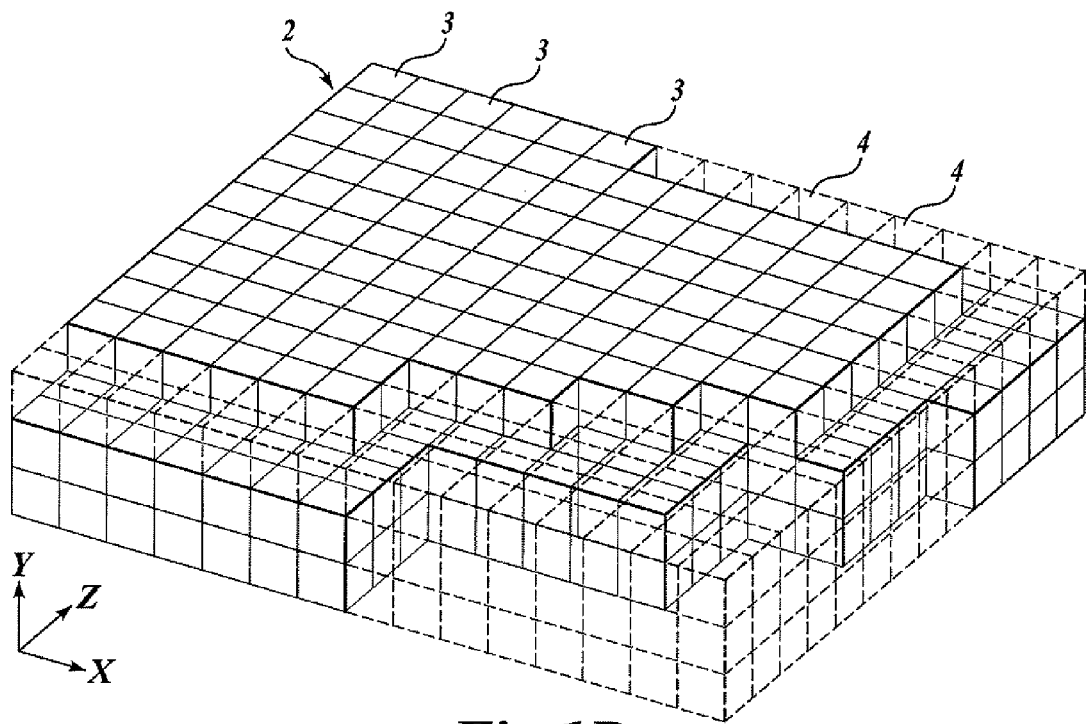
FIG. 1B is a schematic view of a voxel set representing a horizontal stabilizer part of the airplane object of FIG. 1A.
Figure 3A:
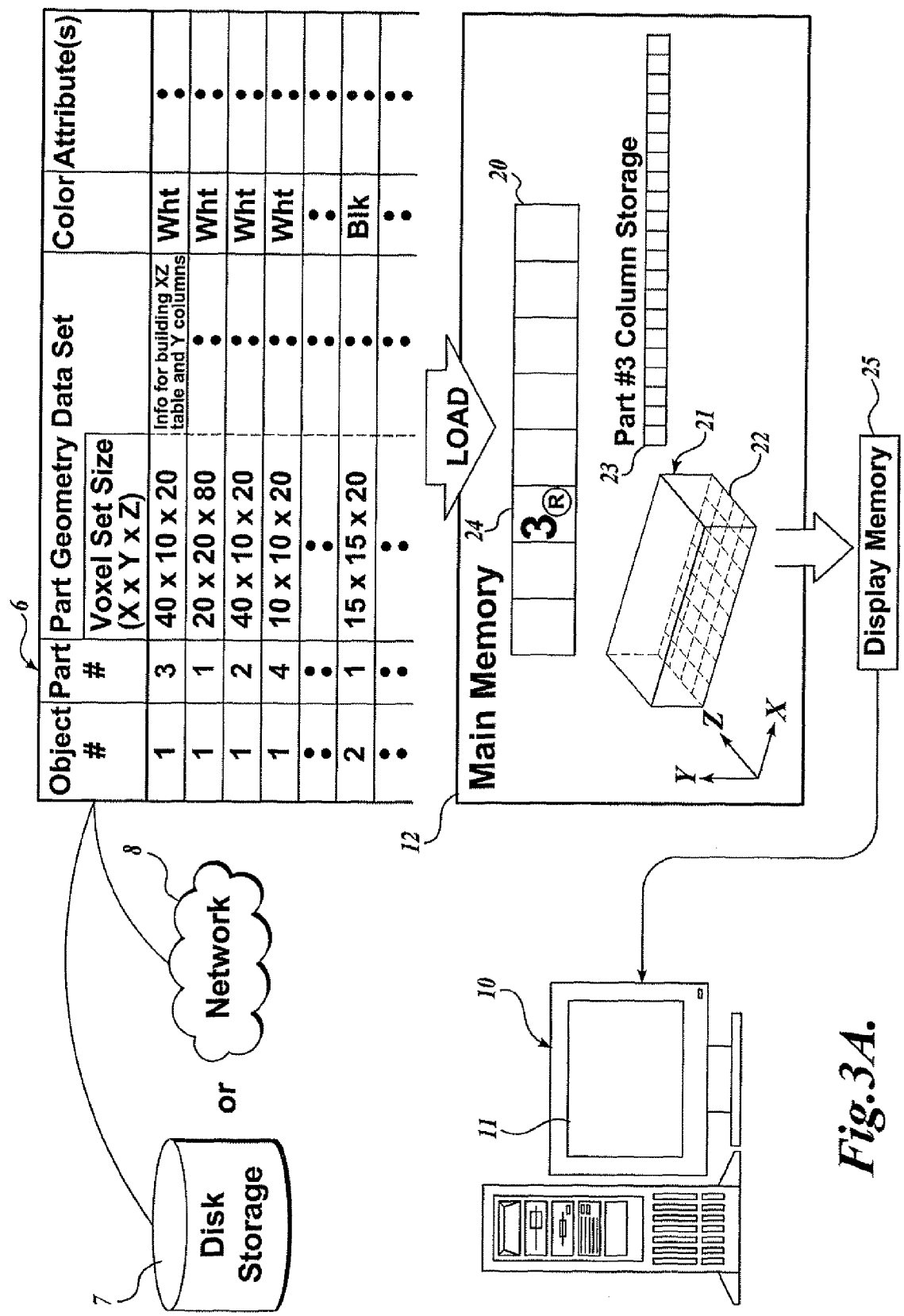
FIG. 3A schematically illustrates the 3D voxel data in a disk storage (or network), which are loaded onto a data structure, such as the one shown in FIG. 2, in a computing device (e.g., a personal computer) for display.

FIG. 3A schematically illustrates one example of 3D voxel data 6 included in a disk storage 7 or on a network 8. Specifically, the 3D voxel data contain information about each of multiple parts of an object, wherein each part is represented by a voxel set. For example, the first row of the 3D voxel data 6 stores that "Part #3" belonging to "Object #1" is associated with its "Part Geometry Data Set" that defines the geometric shape of Part #3, attribute "Color white," and any number of additional attributes (texture, normal, weight, density, etc.). Likewise, the second row of the 3D voxel data 6 stores that "Part #1," also belonging to "Object #1," is associated with its "Part Geometry Data set" that defines the geometric shape of Part #1, "Color white," and any other attributes. Each "Part Geometry Data Set" contains information necessary to define the shape of a part, such as the size of the voxel set that represents the part (see the voxel set 2 in FIG. 1B), and information necessary to construct a XZ table and Y columns to define the geometric locations of occupied voxels within the voxel set (see the occupied voxels 3 in FIG. 1B), which will be discussed in detail later.

The 3D voxel data 6 may include information about multiple objects. For example, the bottom row of the 3D voxel data 6 shown in FIG. 3A stores that "Part #1" (different from "Part #1" of "Object #1") belonging to "Object #2" is associated with its "Part Geometry Data Set" that defines the geometric shape of Part #1 of Object #2, "Color black," and any other attributes.

In the illustrated example of the 3D voxel data 6, the number of parts belonging to an object to be rendered is known before parts data in the data 6 are loaded. For example, the order in which multiple parts are to be rendered to form an object may be predefined, and the multiple parts may be arranged in the 3D voxel data 6 in the predefined order, such as Par #3, Part #1, Part #2, and so on, as in the example of FIG. 3A. Also, in other examples of 3D voxel data, information necessary to allocate a voxel set space and construct an empty XZ table for all parts may be known (or pre-loaded) before the rest of the part geometry data set necessary to build Y columns for each part is loaded. Thus, it should be understood by one skilled in the art that the 3D voxel data 6 of FIG. 3A is merely an example, and various alternatives are possible.

Figure 3B:
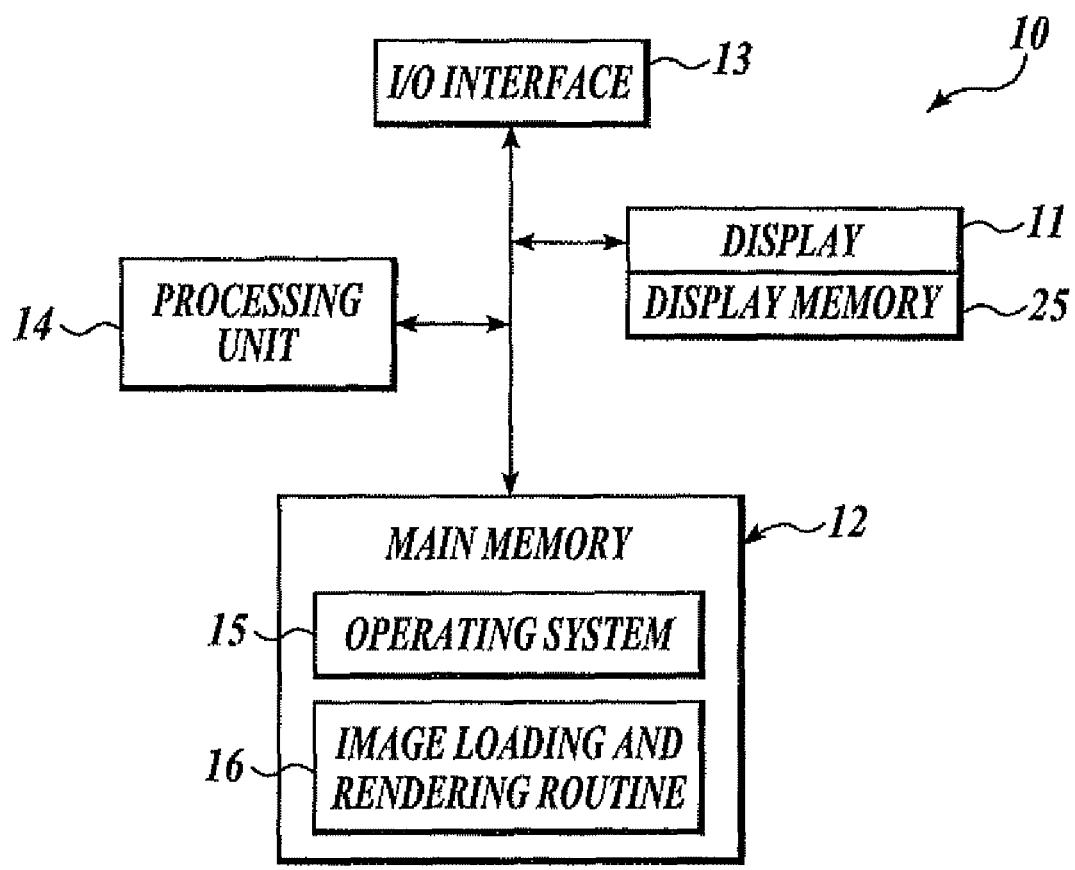
FIG. 3B is a block diagram of several components of the computing device of FIG. 3A, which may be used to render 3D voxel data as a 2D image.

To render the 3D voxel data 6 as a 2D image on a computing device 10 (e.g., desktop PC, laptop) with a display screen 11, the 3D voxel data need to be loaded onto the computing device 10 or, more specifically, into its main memory 12. FIG. 3B is a block diagram illustrating several of the key components of the computing device 10, which may be used to render 3D voxel data into a realistic 2D image. Those skilled in the art will appreciate that the computing device 10 may include many more components than those shown in FIG. 3B. However, it is not necessary that all of these generally conventional components be shown in order to disclose an enabling embodiment for practicing the invention. As shown in FIG. 3B, the computing device 10 includes the display screen 11 (including a display memory 25), the main memory 12, a processing unit 14, and an input/output ("I/O") interface 13, all interconnected via a bus. The I/O interface 13 is provided for connection to other devices, such as the disk storage 7 or the network 8, from which 3D voxel data are to be loaded onto the computing device 10 (or the main memory 12). The I/O interface 13 includes the necessary circuitry for such a connection and is constructed for use with the necessary protocols, as will be appreciated by one skilled in the art.

The main memory 12 generally comprises a random access memory ("RAM"), a read-only memory ("ROM"), and a permanent mass storage device, such as a hard disc drive, tape drive, floppy disc drive, optical disc drive, magneto-optical disc drive, flash memory drive (e.g., USB flash drive), drum memory, or combination thereof. Note that the disk storage 7 including 3D voxel data may be a peripheral storage device attached to the main memory 12. The main memory 12 stores an operating system 15 and an image loading and rendering routine 16, which is used to load 3D voxel data and to render the loaded 3D voxel data as a 2D image. The present invention according to one aspect is directed to optimizing the loading and rendering routine 16 to eliminate the potential for deadlocking.

Although an exemplary computing device 10 has been described that generally conforms to a conventional general purpose computing device, those skilled in the art will appreciate that a computing device 10 may be of any of a great number of devices capable of rendering 3D voxel data into a 2D image. However, in various exemplary embodiments of the present invention, the computing device 10 does not require specialized hardware. Rather a standard processor, as used in a typical laptop, desktop computer or PDA, is sufficient. Further, a constrained memory, i.e., a limited amount of memory relative to a typical computer graphics rendering system, is sufficient. Neither specialized hardware nor a significantly large amount of memory is necessary because the 3D voxel data are arranged and manipulated in a data structure that facilitates fast storage, retrieval, and rendering of voxels. Such a data structure is described in commonly owned U.S. Pat. No. 7,050,054 B2, incorporated by reference above.

Figure 5A:
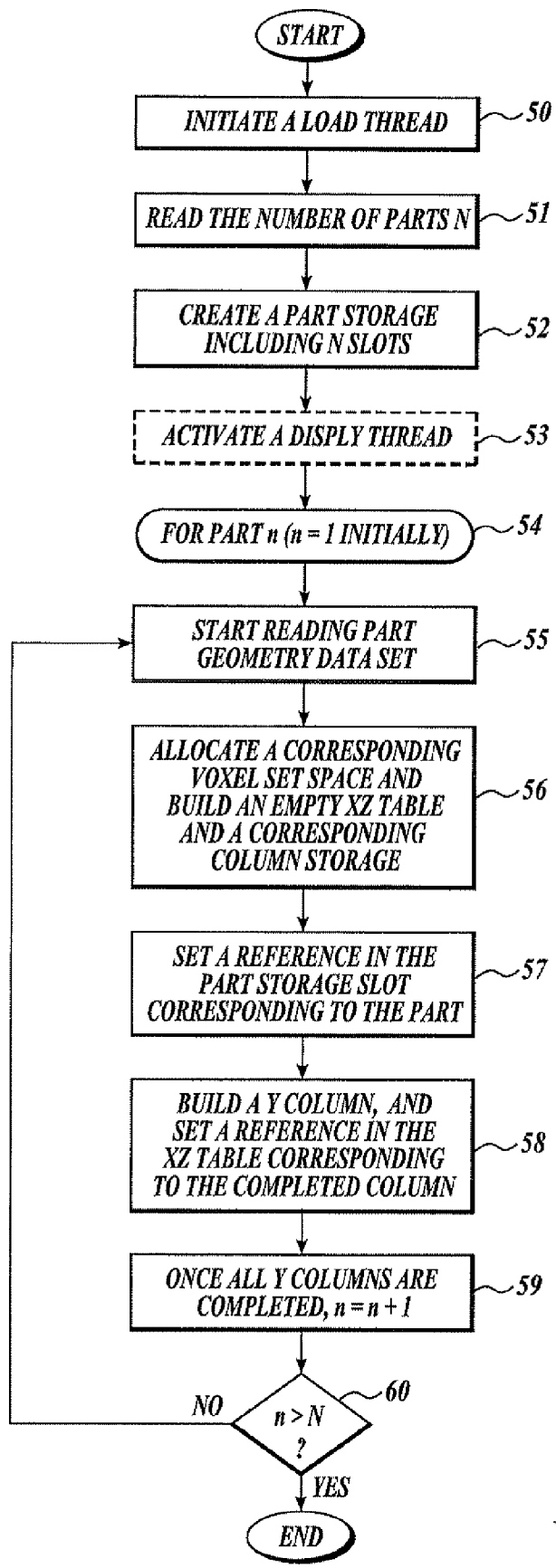
FIG. 5A is a flow chart illustrating the operations of a load thread to load 3D voxel data from a storage to a computing device, according to one aspect of the present invention.
Figure 5B:
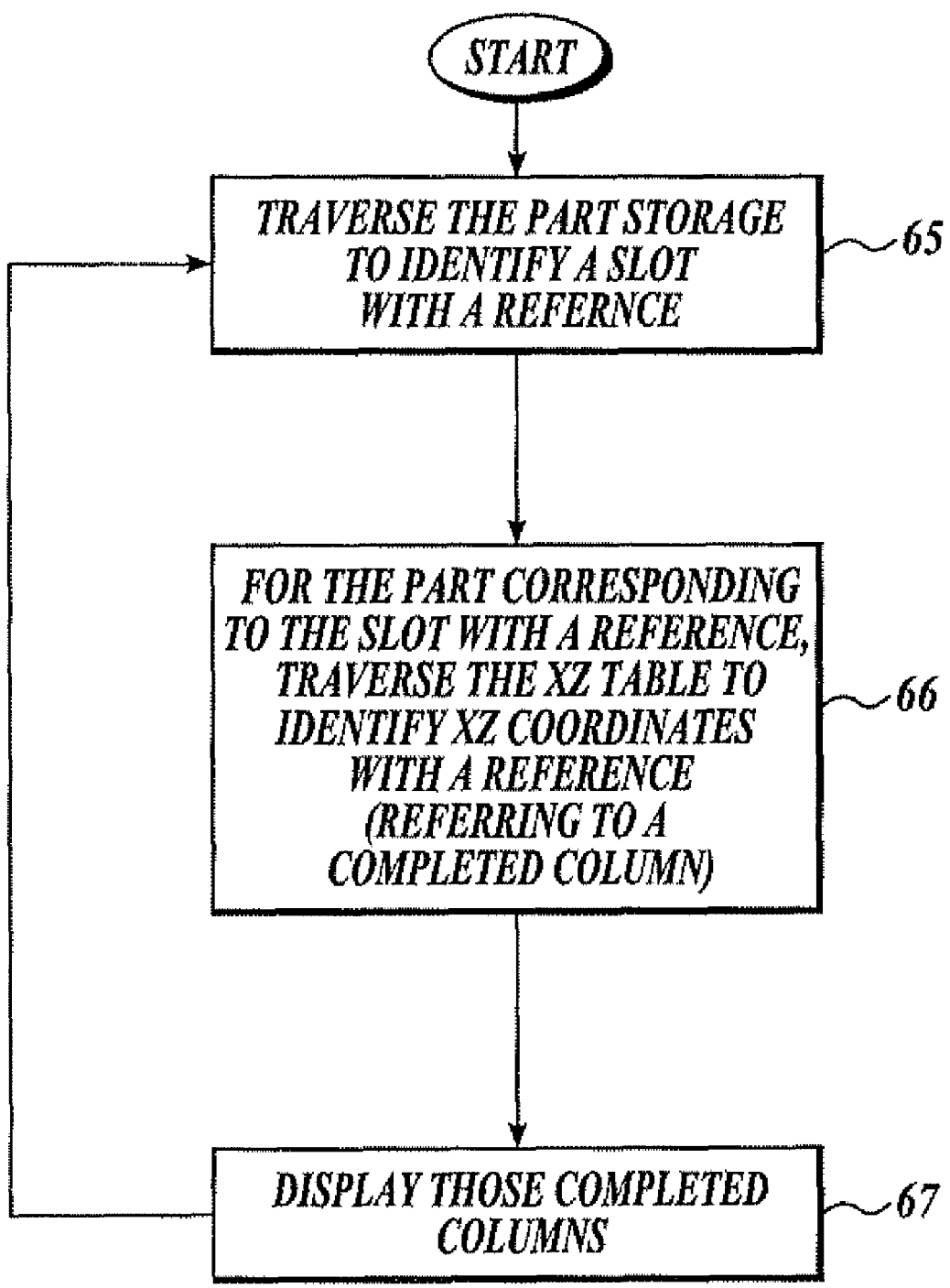
FIG. 5B is a flow chart illustrating the operations of a display thread to render the 3D voxel data as a 2D image, according to one aspect of the present invention.

Referring back to FIG. 3A, the operations of the image loading and rendering routine 16 are described, with additional reference to FIGS. 5A and 5B. FIG. 5A is a flow chart illustrating the operations of a load thread to load 3D voxel data from the disk storage 7 or the network 8 to the main memory 12 according to one aspect of the present invention. FIG. 5B is a flow chart illustrating the operations of a display thread to render the loaded 3D voxel as a 2D image according to one aspect of the present invention. According to various exemplary embodiments of the present invention, in the image loading and rendering routine 16, both the load thread and the display thread can run in no particular pattern without the risk of deadlocking. Specifically, the load thread runs to progressively load multiple parts (or multiple portions within each part) on a "hot-plug-in" basis without having to reshuffle previously loaded parts or portions, and further without having to wait for any operation in the display thread. Likewise, the display thread runs to display an increasing number of multiple parts (or multiple portions within each part) as they become available for display, at arbitrary moments in a random order without having to wait for any operation in the load thread. According to the various exemplary embodiments of the present invention, only those fully loaded (or fully constructed) parts, or portions within each part, become available for display, so that it is impossible for the display thread to attempt to render any incomplete data, which in turn may trigger crash. (Conventional techniques of preventing such crashes use synchronization, which is prone to deadlocking).

In FIG. 5A, at step 50, a load thread is initiated. At step 51, the load thread reads the number "N" of parts to be loaded and rendered to form a 2D image of an object. This may be done, for example, by reading the number (and order) of parts to be rendered to form an object in an input stream (of data) instructing the rendering of the object. For example, eight parts are needed to render the airplane object 1 shown in FIG. 1A.

At step 52, the load thread creates a part storage 20 in the main memory 12, which includes "N" number of slots. In the illustrated example of FIG. 3A, the part storage 20 includes eight slots corresponding to the eight parts that form the airplane object 1.

At step 53, a display thread is activated, whose operations will be described with reference to FIG. 5B. Step 53 is shown as enclosed in a broken-line box because this step relates to the display thread, which may run in parallel with, but in no particular pattern with respect to, the load thread after step 53 (i.e., after the part storage 20 has been constructed in step 52).

At step 54, the first part to be loaded and rendered (n=1) is selected and subsequent operations are performed with respect to the first part. Note that the first part (n=1) does not necessarily correspond to Part #1. Rather, the "first" part is merely the first part to be loaded and rendered, which may be any of the multiple parts forming the object to be rendered. In the illustrated embodiment, Part #3 is the first part to be loaded and rendered.

At step 55, the load thread starts to read the part geometry data set for the first part. The part geometry data set contains information necessary to define the shape of the part, such as the size of the voxel set that represents the part (e.g., "40×10×20") and information necessary to construct a XZ table and Y columns to define the geometric locations of occupied voxels within the voxel set.

At step 56, upon determining the voxel set size, the load thread allocates a storage space 21, having the voxel set size, in the main memory 12. (See FIG. 3A). Further, the load thread builds an empty XZ table 22 (or a XZ base array), which is a table of X and Z coordinates of voxels included in the voxel set. Also, the load thread creates a column storage 23 in the main memory 12, which includes the same number of slots as the number of occupied voxels defined in the XZ table 22. For example, if an XZ table of size 2×2 includes one occupied voxel in the second position of the first row and two occupied voxels in the first position of the second row, then the column storage will have 3 slots. In the illustrated embodiment, the storage space 21 is a representation (or a combination) of the XZ table 22 and the column storage 23. The XZ table is constructed to set references to the corresponding slots in the column storage, as will be described with reference to FIGS. 4A and 4B below.

At step 57, the load thread sets a reference in the slot 24 in the part storage 20 corresponding to the first part, in this example "Part #3". (A reference is shown as ® in FIG. 3A.) As known in the art, a reference is used to refer to an object elsewhere in memory, and in the present case a reference is used to refer to the part voxel data loaded onto the main memory 12. Specifically, the reference is used to direct the display thread to refer to the loaded part voxel data for rendering. In other words, if a reference is not set in the slot, then the display thread will not attempt to render the part corresponding to that slot. The operations of the display thread will be described later in reference to FIG. 5B.

At step 58, the load thread builds Y columns for all the geometric locations defined on the XZ plane or in the XZ table 22. Specifically, for each geometric location defined by its X and Z coordinates, an array of Y coordinates of only those occupied voxels is built and stored as an associated Y column in the column storage 23. For example, if an object is hollow inside, only the Y coordinates of the occupied voxels defining the surface of the object are stored in the Y column.

Figure 4A:
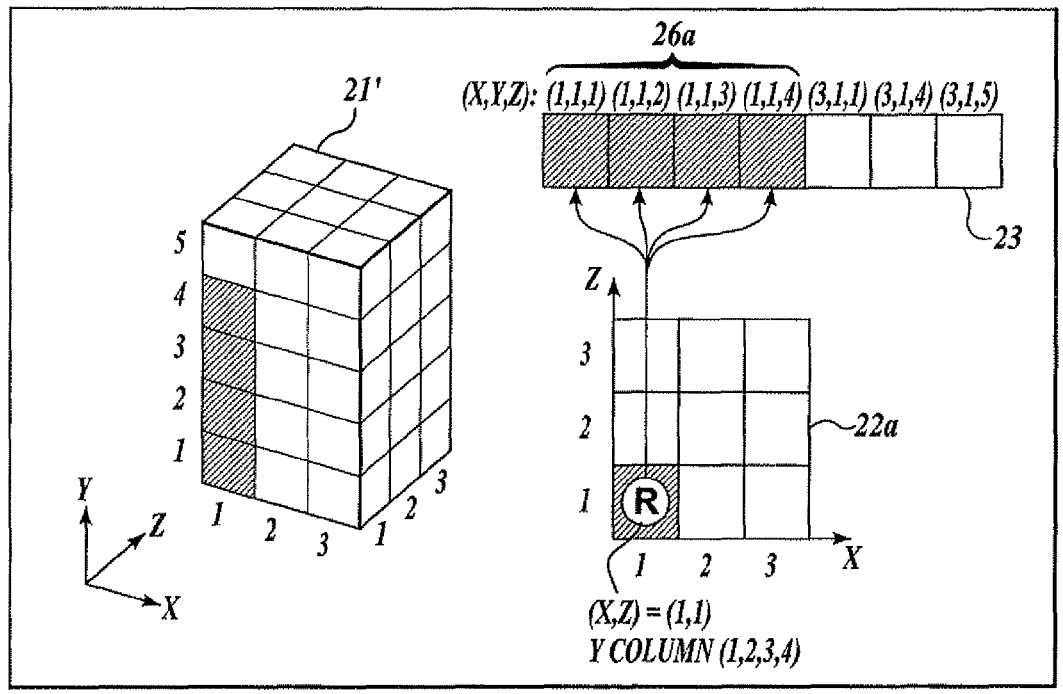
FIGS. 4A and 4B illustrate the time sequence of a portion of the operations of a load thread, according to one aspect of the present invention.
Figure 4B:
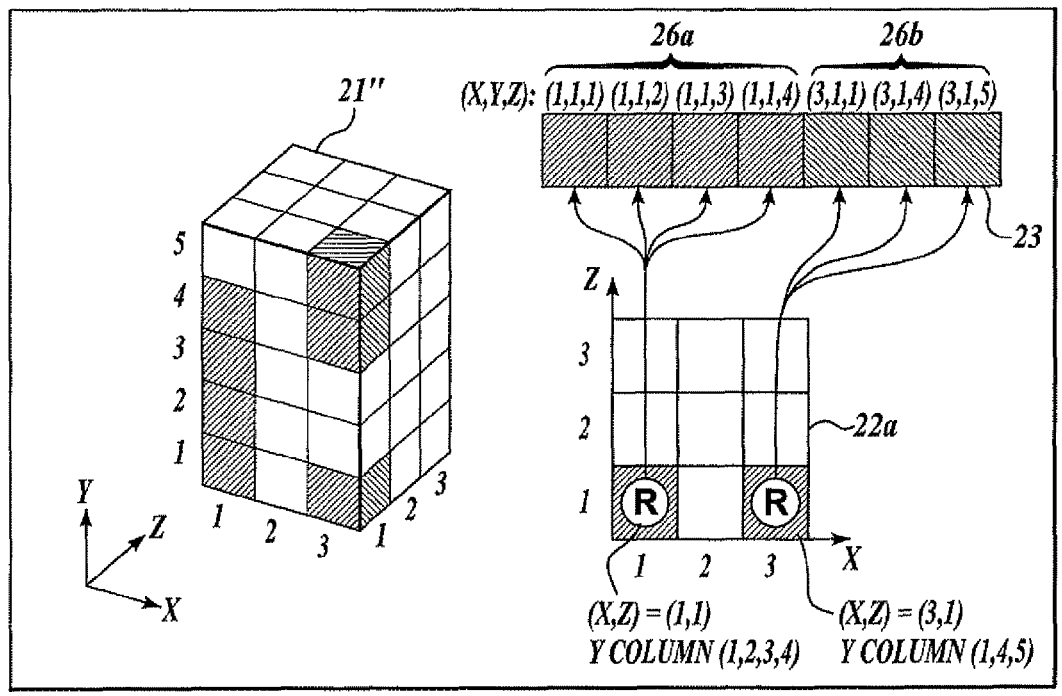

FIG. 4A illustrates building of the Y column for the geometric location (X, Y)=(1, 1) on the XZ table 22a. Since the occupied voxels exist only at Y=1, 2, 3, and 4, and Y=5 is empty, the Y column consists of (1, 2, 3, 4). Once the Y column 26a is completed, the load thread sets a reference $\hat{R}$ in the XZ coordinates in the XZ table 22a ((X, Y)=(1, 1) in the example of FIG. 4A) corresponding to the completed column 26a in the column storage 23. As with the reference set in the part storage 20 discussed above, a reference set in the XZ table 22a is used to direct the display thread to refer to the column voxel data loaded onto the memory 12 for display. In other words, if a reference is not set in the XZ coordinates in the XZ table, then the display thread will not attempt to render the column corresponding to the XZ coordinates. Thus, in the illustrated embodiment, each set of the XZ coordinates in the XZ table includes, or is associated with, two data elements: the number of voxels in the corresponding Y column, and the reference to the Y column in the column storage (e.g., the reference to the beginning of Y values for this Y column in the column storage.) FIG. 4B illustrates additional building of another Y column for the geometric location (X, Y)=(3, 1) on the XZ table 22a. Since the occupied voxels exist only at Y=1, 4, and 5, and Y=2 and 3 are empty, the Y column consists of (1, 4, 5). Once this Y column 26b is completed in the column storage 23, the load thread sets a reference $\hat{R}$ in (X, Y)=(3, 1) in the XZ table 22a corresponding to the newly completed column 26b in the column storage 23. In this manner, Y columns are completed for all the geometric locations defined by its X and Z coordinates, so that eventually references will be set in all of the XZ coordinates in the XZ table 22a.

While the Y columns may be constructed in any arbitrary order, in some embodiments of the present invention, the Y columns are built initially sparsely at XZ geometric locations that are more or less evenly distributed over the entire XZ table, then become increasingly dense with more Y columns being added to fill any space. For example, following the example of FIGS. 4A and 4B, Y columns may be built at (X, Y)=(1, 1), (3, 1), then (3, 3), (1, 3), then (1, 2), (2, 1), (3, 2), (2, 3), (2, 2), in this order. Because the Y columns may be rendered as they become completed, building the Y columns in such order may be more visually appealing to a viewer, who could first see an outline or overall shape of each part, which then becomes increasingly more detailed to reveal its final complete shape.

Referring back to FIG. 5A, at step 59, the load thread determines that all of the Y columns for the current part are completed, and then increments the part number n such that (n=n+1).

At step 60, the load thread determines whether (n>N), that is, whether all of the parts belonging to the object to be rendered have been loaded. If no, the load thread returns to step 55 and repeats the operations through step 60 for the next (or the second) part. If yes, the load thread terminates.

It should be understood by one skilled in the art that FIG. 5A is merely one example of a load thread and various alternatives are possible. For example, while the above example allocates a voxel set space and builds an empty XZ table and a corresponding column storage for each part, and then builds Y columns for that part, it is possible to allocate a voxel set space and build an empty XZ table and a column storage for each of all parts forming an object first, before building Y columns for any part. Still further, while the above example loads one part at a time, it is also possible to load columns in multiple parts in parallel.

FIG. 5B is a flow chart illustrating the operations of a display thread to render the loaded 3D voxel as a 2D image, according to one aspect of the present invention. At step 65, the display thread traverses the part storage 20 to identify any slot in which a reference is set.

At step 66, with respect to the part for which a reference is set in the part storage 20, the display thread traverses the corresponding XZ table 22 to identify any XZ coordinates in which a reference is set. A reference indicates that a Y column has been completed (fully loaded) for the XZ coordinates.

At step 67, the display thread renders on the display screen 11 those columns for which references are set. For example, the display thread takes the loaded 3D voxel data corresponding to those columns from the main memory 12, and puts them into a display memory 25 associated with the display screen 11 of the computing device 10, which results in the data being displayed on the display screen 11.

As shown in FIG. 5B, the display thread repeats steps 65 through 67 continuously, each time going through all references in the part storage 20 and then in the corresponding XZ table(s). If a reference is set, the display thread processes (displays) the associated loaded data. In other words, the display thread displays only the available data, i.e., the data for which references are set. Thus, even if the load thread pauses or aborts, the display thread displays the data that have become available by that time. The display thread continues until all parts of an object are rendered, but even then need not terminate; it may exist until a 3D rendering application itself is terminated. At the same time as the display thread continuously scans through and renders any data available at a particular moment, the load thread progressively loads multiple parts/columns which, in turn, become available for display the next time the display thread scans through loaded data.

Referring back to FIG. 3A, note that the 3D voxel data 6 may include various attributes, such as color, associated with each of the parts to be rendered. These attributes may be used in rendering the parts. For example, "Color white" may be used to render all of the columns of "Part #3" of "Object #1." As described in the background section above, however, each voxel within the voxel set representing a part may also be associated with an unlimited number of attributes (color, texture, normal, weight, density, etc.). Therefore, in various exemplary embodiments of the present invention, the image loading and rendering routine 16 resets a flag to instruct the display thread to use voxel attributes (e.g., voxel colors), instead of part attributes (e.g., part colors), once the voxel attributes become available. For example, the display thread may render each part initially in its part color, and thereafter re-paint the part using voxel colors of all the voxels forming the part, as the voxel colors become available (i.e., loaded from the disk storage 7 or the network 8 onto the main memory 12).

FIGS. 6A-6D illustrate the time sequence of operations of a load thread and a display thread, according to one aspect of the present invention.

Figure 6A:
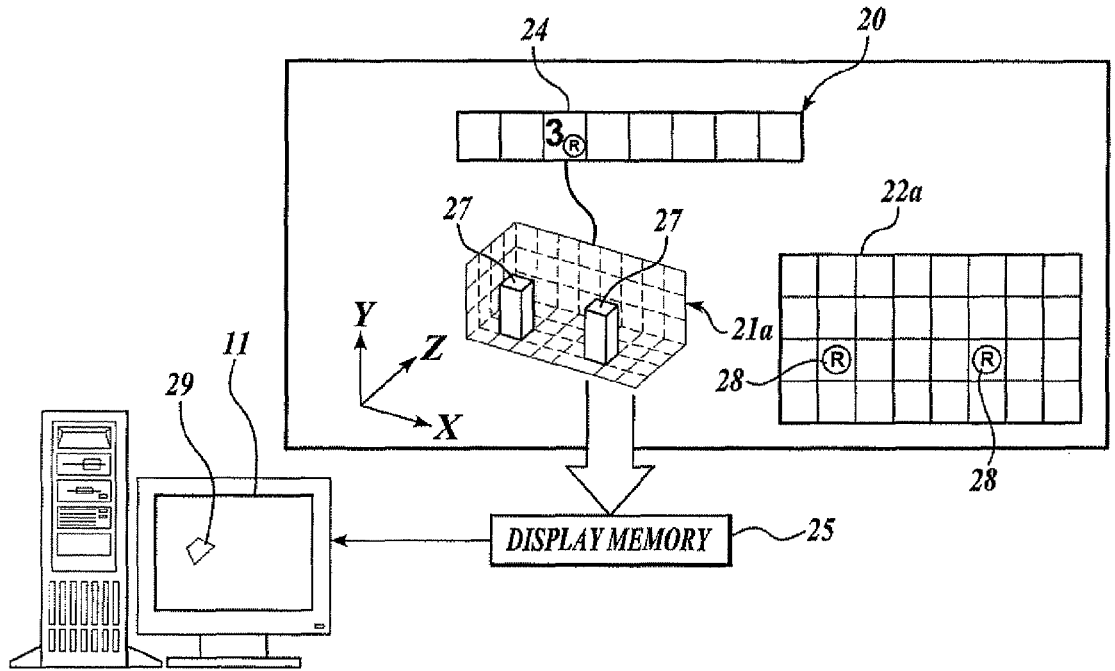
FIGS. 6A-6D illustrate the time sequence of operations of a load thread and a display thread, according to one aspect of the present invention.

FIG. 6A generally corresponds to FIG. 3A, but additionally shows some of the Y columns 27 being completed (in the column storage 23, not shown here, and hence) in the voxel set storage space 21*a* created for "Part #3," for which a reference $\hat{R}$ is set in the slot 24 in the part storage 20. Also, FIG. 6A separately shows an XZ table for "Part #3" 22*a*, which may technically be part of the voxel set storage space 21*a*. In the XZ table 22*a*, the XZ coordinates 28 corresponding to the completed Y columns 27 each include a reference $\hat{R}$. Accordingly, the display thread executing in parallel with the load thread refers to the reference in the slot 24 of the part storage 20 and the references in the XZ coordinates 28 in the XZ table 22*a*, to thereby render only those completed columns 27 on the display screen 11 of the computing device 10. In the illustrated example, "Part #3" corresponds to one of the wing parts of the airplane object 1 in FIG. 1A, and since only some of the Y columns forming that wing part are completed at this time, only a portion 29 of the wing part is rendered on the display screen 11.

Figure 6B:
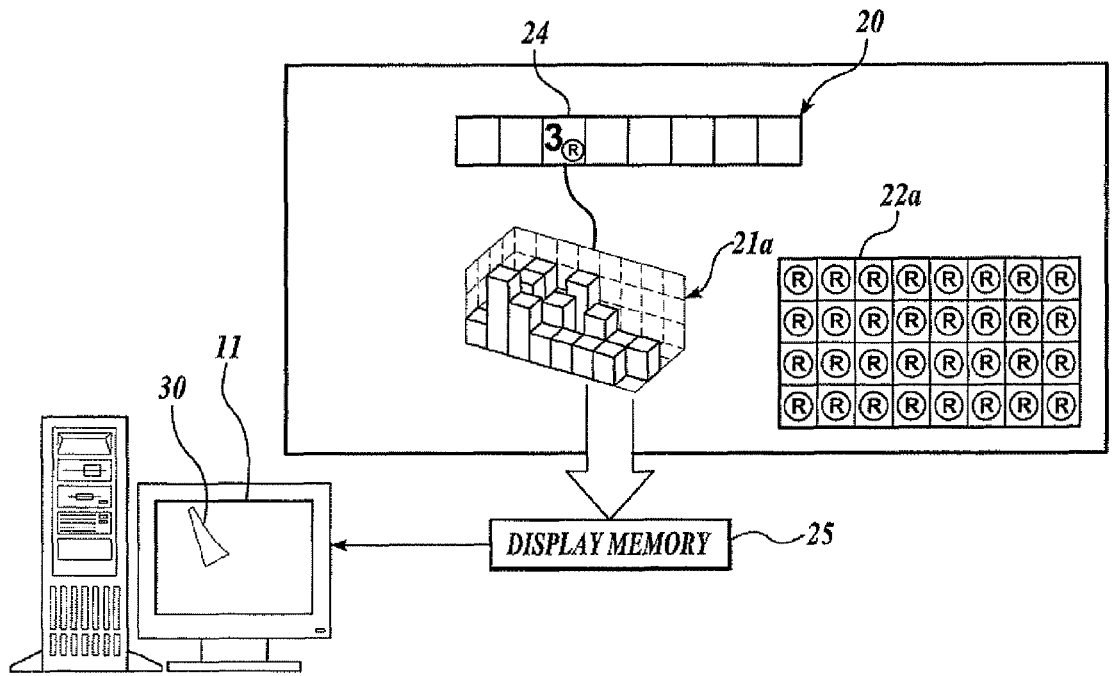

In FIG. 6B, all of the Y columns forming "Part #3" have been completed, as shown by a reference $\hat{R}$ set in each of all the XZ coordinates in the XZ table 22*a*. Accordingly, the display thread renders the entire "Part #3", or the wing part 30 of the airplane object 1, on the display screen 11.

Figure 6C:
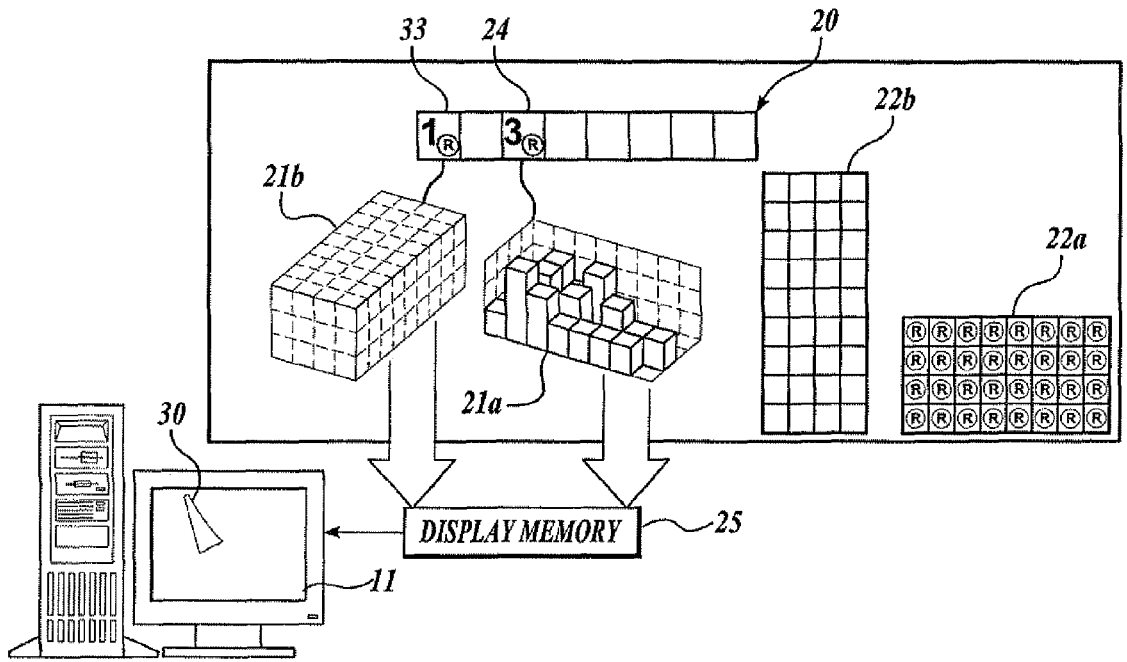

FIG. 6C shows that, since "Part #3" has been fully loaded, the load thread defines a voxel set storage space 21*b* for the next part, "Part #1" in this example, which is a representation of an empty XZ table 22*b* (separately shown here for clarify) and a column storage (not shown) for "Part #1" in the main memory 12. Thereafter, the load thread sets a reference $\hat{R}$ in a slot 33 within the part storage 20 corresponding to "Part #1." Again, note that various parts forming the object to be rendered may be loaded in any arbitrary or pre-defined order, in this case first "Part #3" (corresponding to the slot 24) then "Part #1" (corresponding to the slot 33).

Figure 6D:
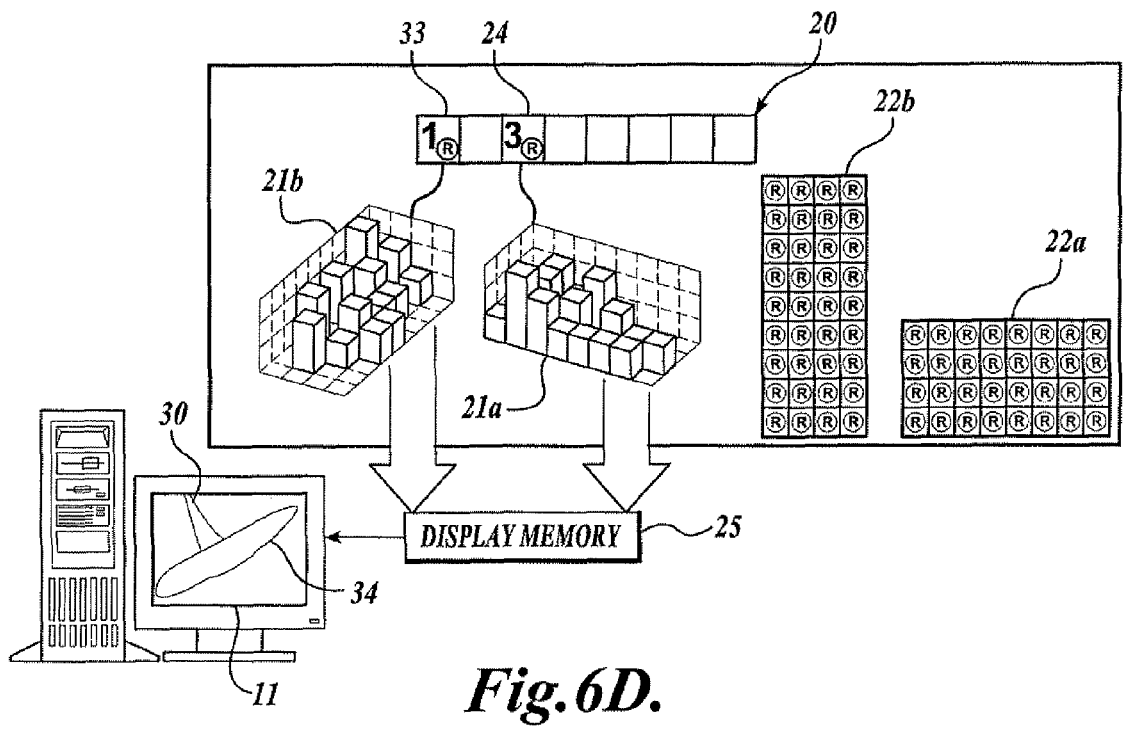

In FIG. 6D, all of the Y columns forming "Part #1" have been completed, as shown by a reference $\hat{R}$ set in each of all XZ coordinates in the XZ table 22*b* for "Part #1." Accordingly, the display thread renders the entire "Part #1," or the fuselage part 34 of the airplane object 1, on the display screen 11. At this time, a viewer sees the complete fuselage ("Part #1") and one of the wings ("Part #3) of the airplane object 1, and will see more parts being added until the entire airplane object 1 is displayed.

As one skilled in the art will appreciate based on the foregoing description, the present invention according to its various exemplary embodiments progressively loads data, such as 3D data, consisting of various segments (e.g., parts) and sub-segments (e.g., columns) in a "hot-plug-in" manner, taking advantage of atomic operations. New pieces of data, each representing a part or a column within a part for example, are progressively loaded and become available for further processing (e.g., displaying) at arbitrary moments and in any order, without requiring any reshuffling of existing pieces of data. For example, as the load thread progressively loads the data onto the main memory of the computing device, the display thread runs in parallel to take the loaded 3D voxel data from the main memory and put them into the display memory of a display screen. The display thread renders only those parts and columns that are completely loaded and become available. The use of references ensures that the display thread will not attempt to render any incomplete columns. Thus, the load thread and the display thread can run in no particular pattern. Further, since the image loading and rendering routine, according to various exemplary embodiments of the present invention, takes advantage of atomic operations and does not require either the load thread or the display thread to wait on locks, both threads can better utilize available hardware resources to thereby improve overall performance.

While illustrative embodiments have been illustrated and described, it will be appreciated that various changes can be made therein without departing from the spirit and scope of the invention. For example, while the illustrated embodiments are generally directed to the application of the present invention in the context of progressive loading and rendering of 3D data, the invention may also be applied in other applications using multiple threads where at least one thread should be prevented from attempting to access dynamically changing data until they are completed. As specific examples, the present invention may be applied in the context of progressive loading and analysis of 3D data, such as statistical analysis of some attributes (weight, density, color, etc.) of each column and/or each part. While the load thread progressively loads 3D data related to parts and/or columns within each part to the main memory 12 of the computing device 10, an analysis thread (not shown) may run in parallel to carry out a statistical analysis of attributes of only those parts and/or columns that are fully completed (or fully loaded). In these examples also, the use of references $\hat{R}$ in a part storage and XZ table(s) ensures that the analysis thread will not attempt to access any incomplete data.

The embodiments of the invention in which an exclusive property or privilege is claimed are defined as follows:

1. A method of progressively loading and further processing data in a multilevel locking-free structure in a computing device having a processing unit and a memory, comprising:
   (a) defining data having a multilevel locking-free structure, the structure including a first level of data including data segments, each of the data segments forming a second level of data, wherein each of the data segments in the second level of data becomes available for further processing when the data segment is referenced in the first level of data;
   (b) loading the data into a multilevel locking-free structure in the memory of the computing device and setting a reference in the first level of data to each of the data segments in the second level of data as the data segment is loaded;
   (c) using the processing unit of the computing device, processing each of the data segments in the second level of data to which a reference is set in the first level of data; and
   (d) repeating steps (b) and (c) such that progressively more data segments are loaded to become available for further processing;
   wherein a data segment includes data sub-segments, each of the data sub-segments forms a third level of data, and each of the data sub-segments in the third level of data becomes available for further processing when the data sub-segment is referenced in the second level of data;

the loading step (b) further comprises setting a reference in the second level of data to each of the data sub-segments in the third level of data as the data sub-segment is loaded;

the processing step (c) further comprises processing each of the data sub-segments in the third level of data to which a reference is set in the second level of data; and the repeating step (d) results in progressively more data sub-segments being loaded to become available for further processing.

2. The method of claim 1, wherein the data comprise 3D data.

3. The method of claim 2, wherein the processing step (c) comprise rendering the 3D data as a 2D image on a display screen.

4. The method of claim 1, wherein the data comprise 3D voxel data, the first level of data defines an object including multiple parts, at least one of the data segments in the second level of data defines a part including multiple columns, and each of the data sub-segments in the third level of data defines a column.

5. The method of claim 4, wherein:

the loading step (b) comprises executing a load thread including operations to:
(i) read number N of parts forming the object;
(ii) create a part storage including N slots;
(iii) read a part geometry data set for part P to allocate a corresponding voxel set space and to create a XZ table and a column storage;
(iv) set a reference in a slot corresponding to part P in the part storage;
(v) build a Y column based on the part geometry data set and set a reference in the XZ coordinates in the XZ table corresponding to the built Y column;
(vi) repeat step (v) for all Y columns forming part P; and
(vii) repeat steps (iii) through (vi) for each of multiple parts forming the object; and the processing step (c) comprises executing a process thread including operations to:
(i) traverse the part storage to identify a slot with a reference;
(ii) traverse the XZ table of a part corresponding to the slot with a reference in the part storage, to identify XZ coordinates in the XZ table with a reference; and
(iii) process the column corresponding to the XZ coordinates with a reference.

6. The method of claim 5, wherein the process thread in the processing step (c) includes further operations to:
(iv) repeat steps (ii) and (iii) for all Y columns forming part P; and
(v) repeat steps (i) through (iv) for each of multiple parts forming the object.

7. The method of claim 5, wherein the process thread comprises a display thread that renders the 3D voxel data on a display screen as a 2D image.

8. The method of claim 5, wherein the process thread comprises a statistical analysis thread that analyzes the 3D voxel data loaded by the load thread.

9. The method of claim 5, wherein operation (vi) of the load thread in the loading step (b) comprises repeating step (v) for all Y columns forming part P in a manner such that Y columns are built initially sparsely at XZ geometric locations that are evenly distributed over the XZ table, then become increasingly dense.

10. The method of claim 5, wherein each part is associated with an attribute and the process thread processes each part according to its attribute.

11. The method of claim 10, wherein each voxel forming each part is associated with an attribute and the process thread processes each voxel forming each part according to the voxel attribute.

12. A non-transitory computer-readable tangible medium comprising computer-executable instructions which, when loaded onto a computer, perform the method of claim 1.

13. A non-transitory computer-readable medium encoded with a multilevel locking-free data structure, the structure including a first level of data including data segments, each of the data segments forming a second level of data;

wherein a reference is set in the first level of data to each of the data segments in the second level of data as the data segment is loaded into a memory of a computing device; and wherein each of the data segments in the second level of data becomes available for further processing in the computing device when the data segment is referenced in the first level of data;

wherein a data segment includes data sub-segments, each of the data sub-segments forms a third level of data;

wherein a reference is set in the second level of data to each of the data sub-segments in the third level of data as the data sub-segment is loaded; and wherein each of the data sub-segments in the third level of data becomes available for further processing when the data sub-segment is referenced in the second level of data.

14. The non-transitory computer-readable medium of claim 13, wherein the data comprise 3D data.

15. The non-transitory computer-readable medium of claim 13, wherein the data comprise 3D voxel data, the first level of data defines an object including multiple parts, at least one of the data segments in the second level of data defines a part including multiple columns, and each of the data sub-segments in the third level of data defines a column.

16. A system for progressively loading and displaying 3D data in a multilevel locking-free structure, wherein the structure includes a first level of data including data segments, each of the data segments forming a second level of data, and each of the data segments in the second level of data becomes available for display when the data segment is referenced in the first level of data, the system comprising:

a memory into which the 3D data are loaded;
a display screen; and
a processing unit coupled to the memory and the display screen, the processing unit executing program code for:
(a) loading the 3D data into a multilevel locking-free structure and setting a reference in the first level of data to each of the data segments in the second level of data as the data segment is loaded;
(b) displaying each of the data segments in the second level of data to which a reference is set in the first level of data; and
(c) repeating steps (a) and (b) such that progressively more data segments are loaded to become available for display;

wherein the data segment includes data sub-segments, each of the data sub-segments forms a third level of data, and each of the data sub-segments in the third level of data becomes available for display when the data sub-segment is referenced in the second level of data;

the loading step (a) further comprising setting a reference in the second level of data to each of the data sub-segments in the third level of data as the data sub-segment is loaded;

the displaying step (b) further comprises displaying each of the data sub-segments in the third level of data to which a reference is set in the second level of data; and the repeating step (c) results in progressively more data sub-segments being loaded to become available for display.

17. The system of claim 16, wherein the first level of data defines an object including multiple parts, at least one of the data segments in the second level of data defines a part including multiple columns, and each of the data sub-segments in the third level of data defines a column.

18. The system of claim 17, wherein:

the loading step (a) comprises executing a load thread including operations to:
(i) read number N of parts forming the object;
(ii) create a part storage including N slots;
(iii) read a part geometry data set for part P to allocate a corresponding voxel set space and to construct a XZ table and a column storage;
(iv) set a reference in a slot corresponding to part P in the part storage;
(v) build a Y column based on the part geometry data set and set a reference in the XZ coordinates in the XZ table corresponding to the built Y column;
(vi) repeat step (v) for all Y columns forming part P; and
(vii) repeat steps (iii) through (vi) for each of multiple parts forming the object; and the displaying step (b) comprises executing a display thread including operations to:
(i) traverse the part storage to identify a slot with a reference;
(ii) traverse the XZ table of a part corresponding to the slot with a reference in the part storage, to identify XZ coordinates with a reference; and
(iii) display the column corresponding to the XZ coordinates with a reference.

19. The system of claim 18, wherein the display thread in the displaying step (b) includes further operations to:
(iv) repeat steps (ii) and (iii) for all Y columns forming part P; and
(v) repeat steps (i) through (iv) for each of multiple parts forming the object.

* * * * *